(12) United States Patent
Natu et al.

(10) Patent No.: US 9,465,647 B2
(45) Date of Patent: *Oct. 11, 2016

(54) PROVIDING STATE STORAGE IN A PROCESSOR FOR SYSTEM MANAGEMENT MODE SELECTIVELY ENABLED BY REGISTER BIT INSTEAD OF EXTERNAL SMRAM

(71) Applicant: INTEL CORPORATION, Santa Clara, CA (US)

(72) Inventors: Mahesh Natu, Sunnyvale, CA (US); Thanunathan Rangarajan, Bangalore (IN); Gautam Doshi, Bangalore (IN); Shamanna M. Datta, Hillsboro, OR (US); Baskaran Ganesan, Bangalore (IN); Mohan J. Kumar, Aloha, OR (US); Rajesh S. Parthasarathy, Hillsboro, OR (US); Frank Binns, Portland, OR (US); Rajesh Nagaraja Murthy, Bangalore (IN); Robert C. Swanson, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 322 days.

This patent is subject to a terminal disclaimer.

(21) Appl. No.: 14/048,451

(22) Filed: Oct. 8, 2013

(65) Prior Publication Data

US 2014/0040543 A1 Feb. 6, 2014

Related U.S. Application Data

(62) Division of application No. 12/550,737, filed on Aug. 31, 2009, now Pat. No. 8,578,138.

(51) Int. Cl.
*G06F 9/48* (2006.01)
*G06F 9/46* (2006.01)
(Continued)

(52) U.S. Cl.
CPC .......... *G06F 9/461* (2013.01); *G06F 9/30101* (2013.01); *G06F 9/30189* (2013.01); *G06F 9/3017* (2013.01); *G06F 9/3851* (2013.01)

(58) Field of Classification Search
None
See application file for complete search history.

(56) References Cited

U.S. PATENT DOCUMENTS 5,357,628 A 10/1994 Yuen
5,689,698 A 11/1997 Jones et al.
(Continued)

FOREIGN PATENT DOCUMENTS

CN 1717645 A 1/2006
CN 1841330 A 10/2006
(Continued)

OTHER PUBLICATIONS

State Intellectual Property Office, P.R. China, Office Action mailed Nov. 12, 2013 in Chinese application No. 201010277405.1.
(Continued)

*Primary Examiner* — Kenneth Kim
(74) *Attorney, Agent, or Firm* — Trop, Pruner & Hu, P.C.

(57) ABSTRACT

In one embodiment, the present invention includes a processor that has an on-die storage such as a static random access memory to store an architectural state of one or more threads that are swapped out of architectural state storage of the processor on entry to a system management mode (SMM). In this way communication of this state information to a system management memory can be avoided, reducing latency associated with entry into SMM. Embodiments may also enable the processor to update a status of executing agents that are either in a long instruction flow or in a system management interrupt (SMI) blocked state, in order to provide an indication to agents inside the SMM. Other embodiments are described and claimed.

12 Claims, 4 Drawing Sheets

(51) Int. Cl.
*G06F 9/30* (2006.01)
*G06F 9/38* (2006.01)

(56) References Cited

U.S. PATENT DOCUMENTS

| | | |
|---|---|---|
| 5,974,563 A | 10/1999 | Beeler, Jr. |
| 6,240,414 B1 | 5/2001 | Beizer et al. |
| 6,571,206 B1 | 5/2003 | Casano et al. |
| 6,766,326 B1 | 7/2004 | Cena |
| 7,426,652 B2 | 9/2008 | Liccione et al. |
| 7,555,671 B2 | 6/2009 | Nachimuthu et al. |
| 8,571,206 B2 | 10/2013 | Kodama et al. |
| 2002/0169951 A1 | 11/2002 | Zimmer |
| 2003/0200272 A1 | 10/2003 | Campise et al. |
| 2004/0107374 A1 | 6/2004 | Cooper et al. |
| 2004/0268175 A1 | 12/2004 | Koch et al. |
| 2005/0086405 A1 | 4/2005 | Kobayashi et al. |
| 2005/0149929 A1 | 7/2005 | Srinivasan et al. |
| 2005/0216577 A1 | 9/2005 | Durham et al. |
| 2005/0246345 A1 | 11/2005 | Lent et al. |
| 2006/0224685 A1 | 10/2006 | Begun et al. |
| 2007/0277223 A1 | 11/2007 | Datta et al. |
| 2008/0040524 A1 | 2/2008 | Zimmer et al. |
| 2009/0037932 A1 | 2/2009 | Clark et al. |
| 2009/0063836 A1 | 3/2009 | Rothman et al. |
| 2009/0157359 A1 | 6/2009 | Chernoff |
| 2009/0172233 A1 | 7/2009 | Zmudzinski |
| 2009/0172369 A1 | 7/2009 | Stillwell, Jr. et al. |

FOREIGN PATENT DOCUMENTS

| | | |
|---|---|---|
| JP | 2004-185602 | 2/2004 |
| WO | WO 2004051461 | 6/2004 |
| WO | WO 2009/017706 | 2/2009 |

OTHER PUBLICATIONS

Japanese Patent Office, Office Action mailed Mar. 24, 2015, in Japanese Application No. 2013-250360.
German Patent and Trademark Office, Office Action mailed May 29, 2013, in German application serial No. 10-2010-034-555.5.
Japanese Patent Office, Office Action mailed May 28, 2013 in Japanese application No. 2012-517932.
State Intellectual Property Office, P.R. China, Office Action mailed Jul. 31, 2012 in Chinese application No. 201010277405.1.
Patent Cooperation Treaty, Notification of Transmittal of International Search Report and the Written Opinion of the International Searching Authority mailed Mar. 31, 2011 in international application No. PCT/US2010/044089.

PROVIDING STATE STORAGE IN A PROCESSOR FOR SYSTEM MANAGEMENT MODE SELECTIVELY ENABLED BY REGISTER BIT INSTEAD OF EXTERNAL SMRAM

This application is a divisional of U.S. patent application Ser. No. 12/550,737, filed Aug. 31, 2009, the content of which is hereby incorporated by reference.

BACKGROUND

Most computer system processors support a special mode of operation called system management mode (SMM). SMM provides a distinct operating environment that is transparent to operating system (OS) software. This mode is often used by original equipment manufacturers (OEMs) to perform special tasks such as system management, device, power and thermal management. Server-related reliability, availability and serviceability (RAS) functions are usually implemented using SMM. SMM is typically entered by sending a system management interrupt (SMI) message to the processor. Upon acknowledging the SMI, the processor saves the current processor context, also called the Processor Save State, to a portion of system memory that is specifically allocated to SMM, referred to as system management random access memory (SMRAM), and executes SMI handler code contained in SMRAM. When the SMI handler has completed its operations, it executes a special (valid in SMM only) resume instruction, which causes the processor to reload the saved processor context from the SMRAM and resume executing the interrupted task.

In a multiprocessor system, generally a SMI message is broadcasted to all processors. The SMI handler selects one processor, referred to as the SMM monarch, to handle the event. This processor waits until all other processors rendezvous inside SMM before handling the SMI event. Non-monarch processors stay in SMM until the monarch completes the event handling. When the SMM event has been handled, the monarch will signal the other processors to exit SMM. This synchronized entry and exit behavior is implemented to prevent any resource conflicts between the two parallel environments (OS and SMM). That is, if some processors are active in the OS environment and the rest are active in the SMM environment at the same time, it is possible that they may modify a shared resource and thereby interfere with each other's operations, causing the system to crash. In addition, certain SMM events can only be handled by a specific logical processor or a set of logical processors. A broadcast ensures that this condition is always met, since all logical processors will enter SMI.

Thus, SMI handling in a multiprocessor system is complex and can consume all system resources, preventing the handling of other useful work as while a processor is in SMM, it is not available to the operating system.

DETAILED DESCRIPTION

In various embodiments, on-die storage can be used as an alternative to using external physical memory to store the save state of individual threads on SMM entry/exit. In contrast, current systems are dependent on external physical memory for entering and exiting SMM. This SMM dependency on system RAM results in scaling, performance and reliability related limitations in mission critical applications, and can be avoided using an embodiment of the present invention. Note that as used herein, the term "thread" may refer to a hardware thread that includes storage in a processor for the architectural state associated with a process (e.g., a register file and associated configuration and status registers). As used herein, the term "hardware thread" is used synonymously with the term "logical processor." Each processor core may include multiple logical processors each having a dedicated architectural state storage but which shares other core resources such as front end units, execution units and so forth.

In different implementations, the on-die storage provided to store the save state of any active threads during a SMM can be an on-die Static RAM (SRAM) or a register file in the processor itself to serve as a small dedicated memory for save state storage. Some processors may include an on-die SRAM for specific tasks like power management, e.g., an OS-managed low power state such as in accordance with an Advanced Configuration and Power Interface (ACPI) state (e.g., C6 state or other power management operations). In such processors, a portion of this SRAM, partitioned on a per-thread basis, can be reserved for each thread's SRAM save state. As one example, each logical processor may use 1 kilobyte (KB) of SRAM storage for SMM save state. If a given processor cannot dedicate this amount of SRAM for SMM save state, an embodiment can be implemented such that it can utilize SRAM reserved for C6 flows. In this case, C6/C7 transitions inside SMM can be demoted to a lower low power state (e.g., C3) to ensure mutually exclusive use of the shared SRAM space for SMM state save. Some processors do not implement dedicated SRAM for C6 state saves and instead utilize a portion of a last level cache (LLC) for storing processor state during a C6 state save. In these processors the SMM save state can be stored in the LLC.

Once saved, this internal SMM save state may be accessed in different manners. As examples, the internal state can be accessed using model-specific register (MSR) addressing on a per-thread basis, or a backwards compatible mechanism. Conventionally, a processor can access SMM save state at certain system memory addresses. The backwards compatible mechanism includes logic in the processor that traps a logical processor's access to these legacy memory addresses and redirects those to the appropriate SRAM location. Such redirection can be implemented if absolute backwards compatibility with existing basic input/output system (BIOS) software is required. These MSRs can be read or written in SMM mode only and follow restrictions that are associated with SMM save state. If one logical processor needs access to another processor's save state, this can be accomplished via a software protocol.

Figure 1:
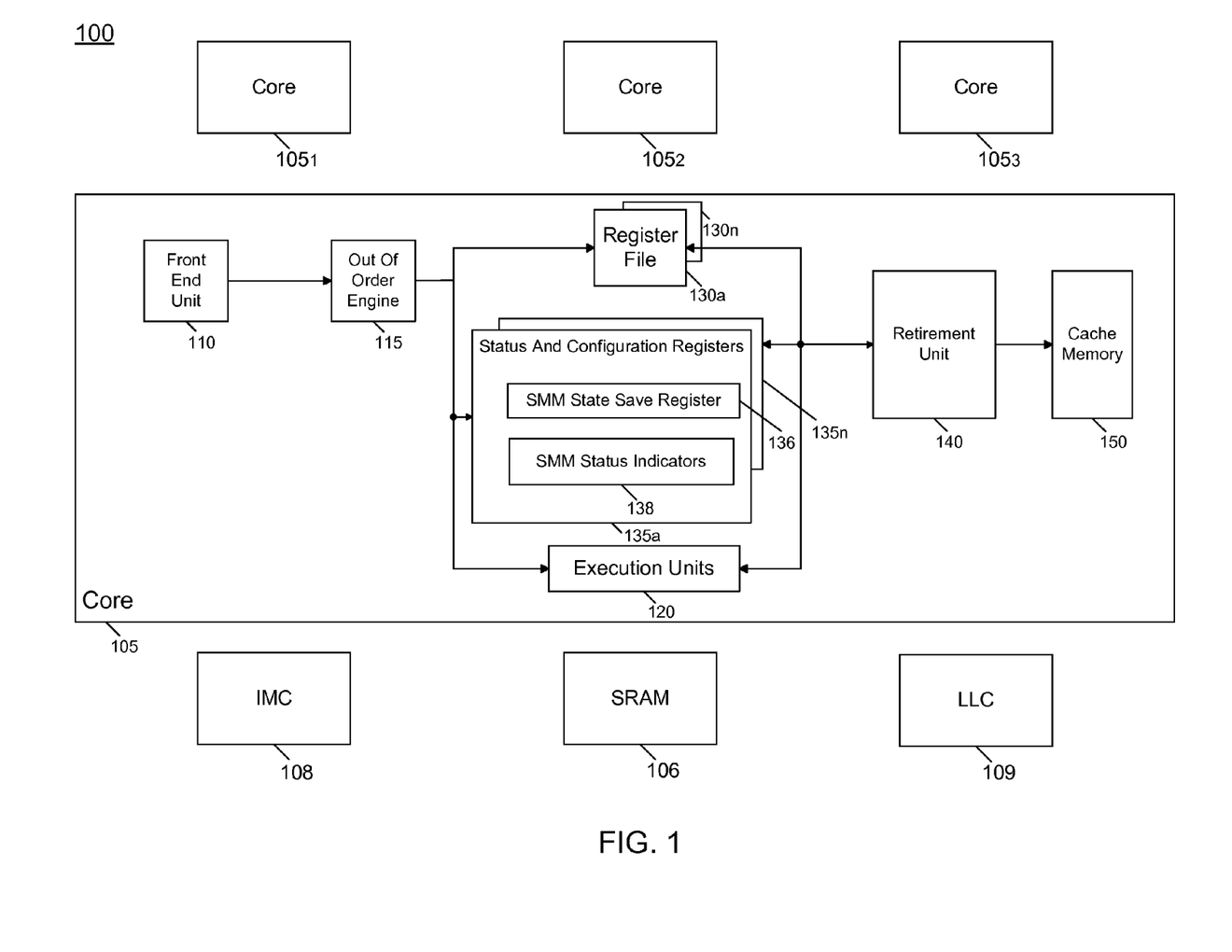
FIG. 1 is a block diagram of a processor in accordance with one embodiment of the present invention.

In some embodiments, a dedicated processor identifier leaf (e.g., a CPUID leaf) or a field thereof or a feature-enable MSR (Model-specific Register) bit, can be used to enable the usage of the internal SRAM. Referring now to FIG. 1, shown is a block diagram of a processor in accordance with one embodiment of the present invention. As shown in FIG. 1, processor 100 may be a multi-stage pipelined out-of-order processor. Processor 100 is shown with a relatively simplified view to illustrate various features used in connection with the SMM techniques described herein. As seen, processor 100 may be a multi-core processor including a plurality of processor cores 105 and which may be formed on a single semiconductor die. While shown with four such cores in the embodiment of FIG. 1, understand the scope of the present invention is not limited in this regard. As further seen in FIG. 1, additional components may be present in processor 100. For example, an integrated memory controller (IMC) 108 may be present, along with a static random access memory (SRAM) 106. As discussed above, in some implementations this memory may be used to store context state in accordance with an embodiment of the present invention that would otherwise be stored in SMRAM. Still further, processor 100 may include a last level cache (LLC) 109, which may be a shared cache that is shared among all processor cores.

As shown in FIG. 1, processor 100 includes front end unit 110, which may be used to fetch macro-instructions to be executed and prepare them for use later in the core. For example, front end unit 110 may include an instruction prefetcher, an instruction decoder, and a trace cache, along with microcode storage as well as a micro-instruction (μop) storage. The instruction prefetcher may fetch macro-instructions from memory and feed them to the instruction decoder to decode them into primitives, i.e., μops for execution by the processor. The trace cache may take decoded μops and assemble them into program ordered sequences. Of course, additional components and features may be implemented in front end unit 110.

Coupled between front end unit 110 and execution units 120 is an out-of-order (OOO) engine 115 that may be used to receive the micro-instructions and prepare them for execution. More specifically, OOO engine 115 may include various buffers to re-order micro-instruction flow and allocate various resources needed for execution, as well as to provide renaming of logical registers onto storage locations within various register files such as a register file 130*a*. Register file 130 may include separate register files for integer and floating point operations. Note multiple register files 130*a-n* may be present, each for a different logical processor. Additional registers, namely status and configuration registers 135 may also be present. As seen, each set of registers 135*a-n* may be for a different logical processor. These various registers may be used to configure a core for different operating modes as well as to provide status information regarding the thread and different instructions executed.

In the example shown in FIG. 1, such registers may include a SMM save state register 136. In various implementations, a plurality of such registers may be present, each associated with a given thread operating on the core. As discussed above, such register may store an indicator, e.g., an enable bit, to enable the state of the thread to be stored, e.g., within the core itself when entering into SMM. If this indicator is not enabled, on entry into SMM, a thread's context will instead be stored to SMRAM. In some embodiments, this MSR may contain other bits that can control other processor features. In some embodiments, this register file 135 containing the indicator can be made to be changeable only in SMM, thus protecting it from being maliciously changed by a malware component outside of SMM, increasing both security and robustness of the system.

As further seen, register file 135 may also include one or more SMM status indicator registers 138. Such indicator registers may be in the form of a bitmap or bit vector, with each logical processor having a location to indicate when the logical processor is inhibited from entering into a SMM or whether the logical processor is in a long flow execution. In one embodiment, a separate register may be present for each such indication. Alternately, a single register may be present and a logically combined indicator may thus be used to indicate presence of one these states for each logical processor. Further details regarding use of these registers are described below.

Still referring to FIG. 1, various resources may be present in execution units 120, including, for example, integer, floating point, and single instruction multiple data (SIMD) logic units, among other specialized hardware. Results may be provided to a retirement unit 140, which may operate to determine whether executed instructions can be validly retired and result data committed to the architectural state of the processor, or whether one or more exceptions occurred that prevent a proper retirement of the instructions.

As shown in FIG. 1, retirement unit 140 is coupled to a cache memory 150 which, in one embodiment may be a low level cache (e.g., an L1 cache) although the scope of the present invention is not limited in this regard. Also, execution units 120 can be directly coupled to cache 150 (not shown in FIG. 1). From cache memory 150, data communication may occur with higher level caches, system memory and so forth. While shown with this high level in the embodiment of FIG. 1, understand the scope of the present invention is not limited in this regard. For example, other embodiments may be implemented in an in-order processor.

By storing SMM save state internally to the processor, reliability and robustness of the system may be improved. That is, the physical memory, which is typically a set of external dynamic random access memory (DRAM) devices on which the SMRAM resides, is vulnerable to memory errors. Without an embodiment of the present invention, SMM operations run out of this external memory and hence cannot be relied on in error conditions. Instead using an embodiment of the present invention, SMRAM memory reliability can be improved by executing a SMI handler from non-volatile space when handling errors. For example, the SMM handler can run from a more robust storage like BIOS flash or external SRAM while it is handling memory errors. Also, when SMM save state is internal to the processor the architectural state of this storage can be exposed only through MSRs to the software outside. The micro-architectural state of the processor that is needed to restore machine execution state after SMM code executes a "Resume (RSM)" instruction need not be exposed to outside software as it has no legitimate use for this internal machine state. This also means that malicious software code does not have access to sensitive micro-architecture state (as it would, if the saved data storage is in SMRAM), making the machine more secure and robust.

Embodiments may also improve performance and latency. Many server applications/operating systems are non-uniform memory architecture (NUMA)-optimized and BIOS typically configures memory such that the entire SMRAM, which is a contiguous memory range, is mapped to a single socket. Therefore, all SMM save state/restore state operations will appear as remote writes/remote reads for all logical CPUs, except the ones contained in one socket for which the SMRAM is local. Performance analysis for a server configuration with four sockets, each with 12 cores indicates that SMM save state write operations can be limited by the interconnect and memory bandwidth and can take up to 5 microseconds. As applications become more NUMA optimized, processors may allocate fewer buffers for remote traffic. When that happens, SMRAM save state write and read operations will take an even longer time. Operating systems typically have a limit on how long a CPU can be in SMM, in order to maintain acceptable real time performance and avoid timeouts on high speed network links. Exceeding this limit affects OS responsiveness, application latencies and may even lead to operating system malfunction. Accordingly using an on-die SMM save state in accordance with an embodiment of the present invention reduces latency and thus enables further time allocated for a SMM handler to service the SMM event (the useful work of the SMM).

Additionally, embodiments may improve scalability. In a multiprocessor system, when an SMI occurs, every thread in the system must store its save state in its own dedicated save state region in external system memory, as defined and reserved by the system BIOS during system boot. The total amount of physical memory to be reserved as the SMRAM space required to capture all the save states of all the threads in the system increases linearly with the number of threads in the system. For a multi-core, multi-socket system with symmetric multi-threading support, the amount of space can be fairly large (and may be on the order of approximately 256 KB, in one embodiment). By providing on-die storage for SMM save state, the need for an ever-expanding SMRAM region to accommodate all the cores and threads thereof can be avoided, thereby facilitating scale. It also obviates the necessity for BIOS to find and allocate a unique, non-overlapping region in SMRAM for every thread. Still further, this also saves memory protection regions from being implemented in silicon. In hot plug scenarios, the architecturally defined SMM save state area in SMRAM is below 1 MB. Without an embodiment of the present invention, BIOS sets up a memory protection range and migrates out data to avoid OS attacks and/or interference when adding new processors. Embodiments obviate the need to do this because the saved state is no longer stored in OS visible memory.

Figure 2:
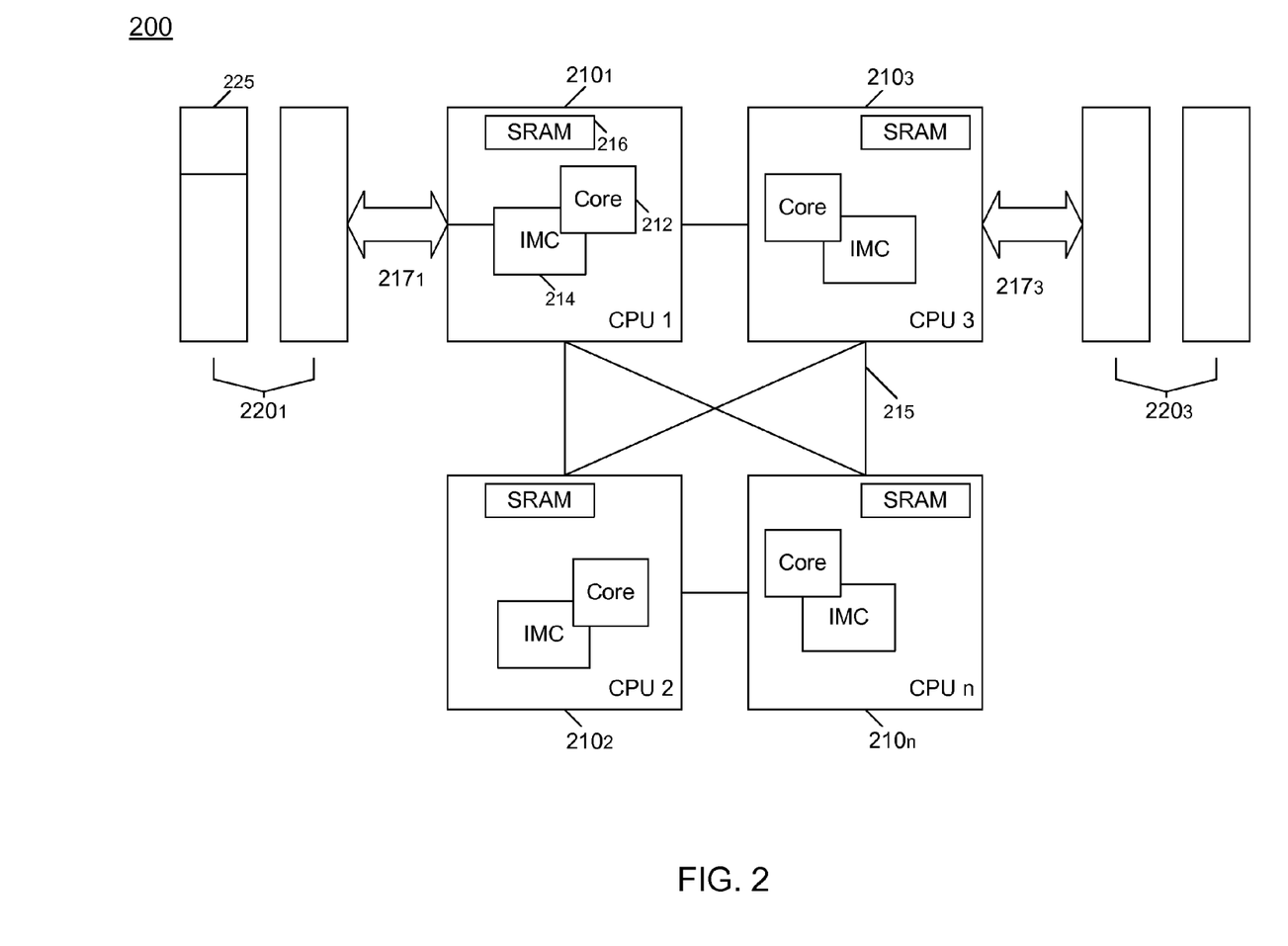
FIG. 2 is a block diagram of a multiprocessor system in accordance with one embodiment of the present invention.

Referring now to FIG. 2, shown is a block diagram of a multiprocessor system in accordance with one embodiment of the present invention. As shown in FIG. 2, multiprocessor system 200 includes a plurality of processors $210_1$-$210_n$ (generically processor 210). While shown with four such processors in the embodiment of FIG. 2, understand the scope of the present invention is not limited in this regard. In the implementation shown in FIG. 2, a non-uniform memory architecture (NUMA) system is present such that system memory $220_1$ and $220_3$ is locally attached to processors $210_1$ and $210_3$ via the interconnect $217_1$ and $217_3$. Thus, access to memory by processors $210_2$ and $210_n$ requires a communication through one of a plurality of point-to-point (PTP) interconnects 215 with one of processors $210_1$ and $210_3$. As seen in the implementation of FIG. 2, memory $220_1$, which may be a DRAM includes a SMRAM 225. In this NUMA architecture, SMRAM 225 is the system management store for the entire system. Accordingly, without an embodiment of the present invention, each processor on a SMM entry or exit needs to save/restore context to this SMRAM 225. This in turn causes large usage of bandwidth on PTP interconnect 215 and interconnect $217_1$, as well as increasing latency for entry into and exit from the SMM.

Accordingly, in various embodiments each processor 210 may include SRAM 216, in addition to one or more cores 212 and an integrated memory controller 214. In various embodiments, SRAM 216 may be dedicated for storage of SMM save states. That is, when a system management interrupt occurs, the context state for the various logical processors of each processor 210 may be stored locally to its SRAM 216, avoiding the need for communication of state information with SMRAM 225. In other embodiments, instead of a dedicated on-die storage, this context state can be stored in on-chip registers, e.g., of a register file or other location such as a cache memory. While shown with this particular implementation in the embodiment of FIG. 2, the scope of the present invention is not limited in this regard. For example, embodiments may be further used with a uniform memory architecture system.

Figure 3:
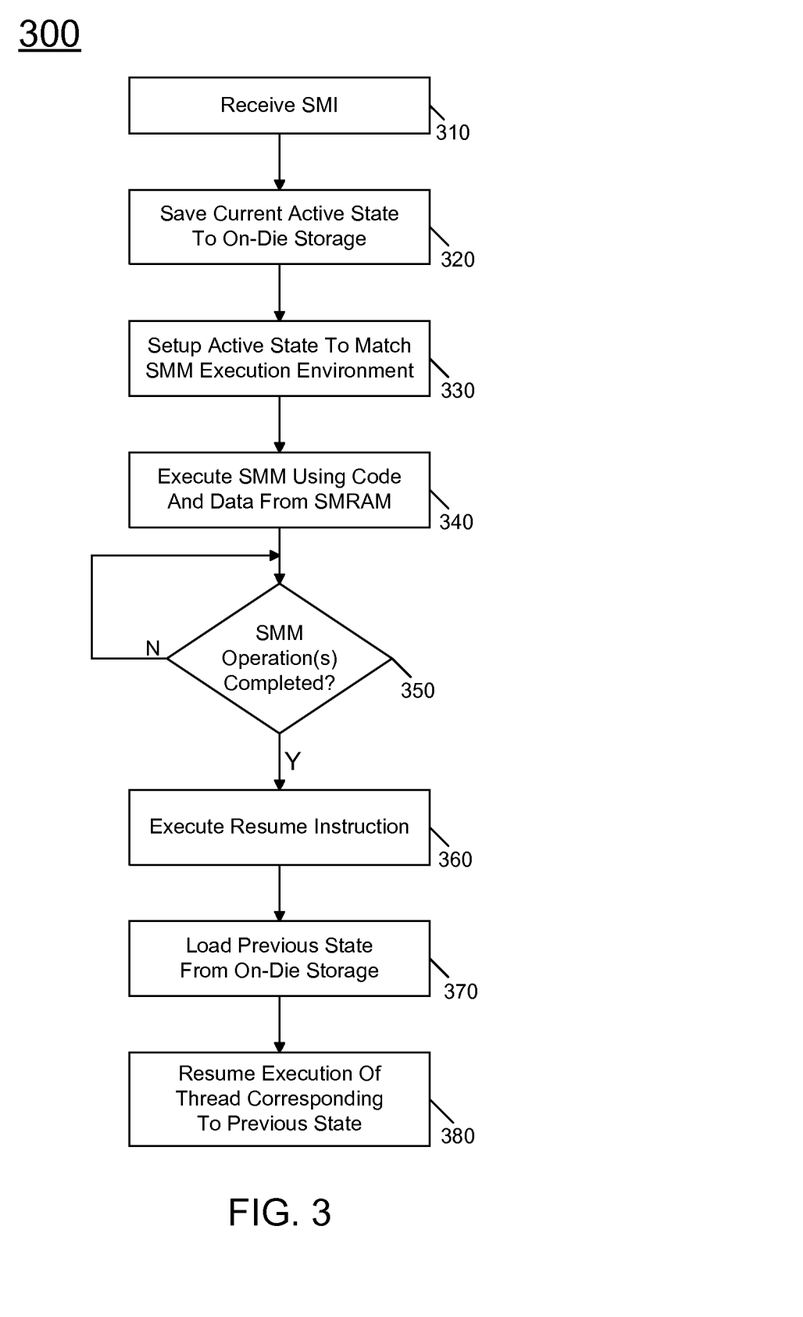
FIG. 3 is a flow diagram of a method in accordance with one embodiment of the present invention.

Referring now to FIG. 3, shown is a flow diagram of a method in accordance with one embodiment of the present invention. As shown in FIG. 3, method 300 may be performed to handle entry into SMM without the need for accessing SMRAM for saving state information. Note for ease of discussion it is assumed that only a single hardware thread is present, although in many implementations multiple threads may enter into SMM together. As seen in FIG. 3, method 300 may begin by receiving a system management interrupt (block 310). Upon receipt of this interrupt, a current active state (e.g., of a given hardware thread) may be saved to an on-die storage (block 320). As discussed above, this on-die storage may be dedicated SRAM, SRAM used for another purpose (e.g., power management states), register storage, an on-die cache storage or so forth.

Referring still to FIG. 3, processor state is modified to match a SMM entry state, e.g., as defined by processor specification (block 330). This state includes values for various control and configuration registers as well as initial values for a register file. This setup thus prepares an SMM execution environment appropriate for a SMM handler by loading predetermined values associated with the SMM entry state into the state storage. When the SMM state has been set up, control passes to block 340, where SMM may be executed using code and data from SMRAM (block 340). Accordingly, a desired SMM operation may be performed. While the scope of the present invention is not limited in this regard, examples of SMM operations include power management operations, error handling operations, or so forth.

It may then be determined whether SMM operations have completed (diamond 350). If not, execution in SMM may continue. If completed, the processor executes a resume instruction (block 360). As a result of this instruction, the previous state may be loaded back into the processor's registers from the on-die storage (block 370). Then, the processor may resume execution of the thread corresponding to this previous state restored back to the active state (block 380). While shown with this particular implementation in the embodiment of FIG. 3, understand that the scope of the present invention is not limited in this regard. For example, in some implementations, rather than executing SMM operations from SMRAM, particularly when the SMM is for handling an error such as a DRAM error, embodiments may instead obtain SMM state information, SMM code and data from a non-volatile storage such as a flash memory.

As described above, silicon storage of an active state can reduce SMM latency. Embodiments may further reduce latency by enabling a faster entry into SMM in certain situations, as now will be discussed.

SMM latency is defined as the duration for which a processor is in the SMM environment per single SMI. There are two main contributors to total SMM latency, processor overhead and OEM BIOS code. This latency must be kept under control to avoid side-effects on the OS environment such as timeouts and clock drifts. Future demands will require this latency to be reduced, which becomes difficult to realize. Currently, SMI latency is dictated to be under approximately 190 microseconds. New usage models like Internet portal data centers and utility computing expect more predictable latencies from applications. As a result, OS vendors are pushing for further reductions in SMM latency. On the other hand, other technologies have the potential to increase SMI latency over time. As examples, the industry push to multi-core processors means that a SMI handler must rendezvous an ever-increasing number of processor cores. New SMM-based capabilities also place additional pressure on SMM latency. For example, high-end RAS capabilities rely on SMM. In addition, some OEMs utilize SMM to deliver unique power management capabilities to differentiate their products. Many OEMs are known to generate SMIs as high as 8 times per second.

Certain instruction set architectures (ISAs) include instructions such as a write back and invalidate instruction (e.g., wbinvd), which invalidates all cache lines and writes them back to memory. These operations can take a long time to complete, e.g., on the order of $10^3$ to $10^7$ processor cycles, particularly in processors that support large cache sizes. In addition, there are certain processor states where a SMI response can be delayed (e.g., C3 and C6 low processor states). Collectively, these instructions and processor states are termed as "long flow" states, which is defined to mean an instruction or process that can take an unusually long number of cycles to complete (e.g., on the order of $10^3$ clocks) and which can delay entry into SMM. In one embodiment, any flow that will delay SMM entry by more than 5 microseconds can be termed as a long flow. With regard to SMM, if one or more logical processor is in a long flow, it delays SMM entry.

As explained above, the SMM monarch waits until all expected logical processors have entered SMM. Upon entry into SMM, each processor sets its own bit in SMRAM indicating it has entered SMM. The monarch waits until all expected processors have set their bits. When one or more logical processor is in a long flow and enters SMM late, it holds up the SMM monarch and thus increases SMM latency. In addition, there are certain architectural states such as a wait for startup interprocessor interrupt (WFS) and a TXT sleep state, where an SMI event is inhibited. If the OS/BIOS places one or more logical processor into a SMI-inhibited state, it will not enter SMM until the OS/BIOS explicitly brings it out of this state. Since a SMI event places all other processors in SMM, the OS is unable to unmask the SMI. Under this scenario, the SMM monarch must rely on a long timeout to determine the presence of a SMI-inhibited processor. These timeouts delay SMM rendezvous and either increase the overall SMM latency or reduce the amount of time available for SMM event handling.

In various embodiments, the need for time-outs inside SMM can be avoided, even where some logical processors are in a long flow. Eliminating such timeouts can improve average SMM latency by 10-20% and worst case SMM latency by at least a few milliseconds.

Embodiments rely on the fact that a processor that is in a long flow or an SMI-inhibited state is unlikely to access a shared resource. In addition, such processor is unlikely to have caused the SMI, and thus its participation is not necessary for SMI processing. Therefore, the SMM monarch can proceed with SMM processing before such processor has entered into a SMM.

However, before proceeding the SMM monarch must be able to reliably detect which processors are in a long flow and/or SMI-inhibited state. To detect processors that are busy in a long flow or in SMI inhibited state, embodiments may provide indicators for these states such as by way of bitmaps. In one embodiment, such indications can be provided via globally visible configuration registers, called LONG_FLOW_INDICATION and SMI_INHIBITED_INDICATION. In this embodiment, one bit can be allocated to each logical processor in a socket. As one example, the registers may be represented by register 138 of FIG. 1. In implementations in which processor microcode is involved in entry to and exit from long flows and SMI inhibited states, the microcode/hardware can populate these register bits. Some of the long flows can incur times longer than 5 microseconds and therefore the ability to not wait for processors in these states can provide significant savings in SMM latency. Future processors may take more than 5 microseconds for SMM microcode entry flow and can itself be considered as a long flow. The SMM monarch can wait until all processors are accounted for, i.e., they either join the SMM or are reported to be in a long flow or in SMI inhibited state. To aid in such determination, one or more tables such as bitmaps stored in SMRAM can be used, as described below.

In one implementation, the monarch processor saves its state and runs SMM preamble code before performing a check of the indicator registers. These steps can easily take more than 0.5 microseconds. This duration is much greater than the propagation time for any in-flight interrupts, ensuring that there is no race condition between SMI delivery to a core and a read of its indicator registers. If the delay is smaller under certain configurations, the monarch processor can insert a small delay loop to make up.

Figure 4:
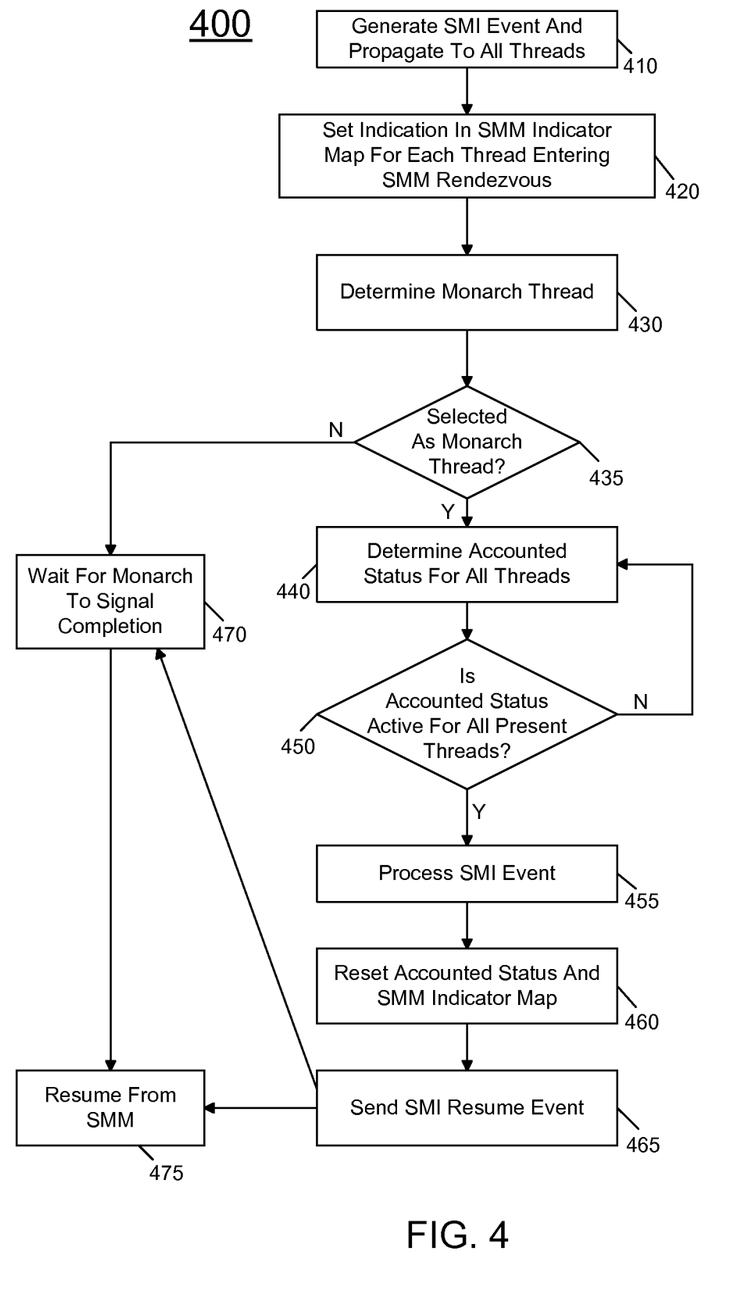
FIG. 4 is a flow diagram of a method in accordance with another embodiment of the present invention.

Referring now to FIG. 4, shown is a flow diagram of a method in accordance with another embodiment of the present invention. Specifically, FIG. 4 shows a flow diagram for handling entry into and exit from SMM when all logical processors need not rendezvous in the SMM state. In this way, the latency associated with waiting for all logical processors before performing SMM operations can be avoided. As seen in FIG. 4, method 400 may begin by generation of an SMI event (block 410). This SMI event may be propagated to all threads. Note that for ease of discussion it is assumed that the threads of FIG. 4 are with regard to a single processor socket, although implementations can be used to rendezvous SMM across multiple sockets.

Next, an indicator may be set in an SMM indicator map for each thread that enters a SMM rendezvous state (block 420). It is to be understood that various preparatory actions to enter SMM can be first performed by the threads, e.g., a state save, such as described above with regard to FIG. 3. Each thread that enters SMM rendezvous state may set an indicator in a SMM indicator map that may be stored in SMRAM. In one embodiment, this map may be a bit map in which each logical processor is associated with a bit of the map, and where logical processors of each socket can be separated into different segments of the map. Thus when a given thread enters into the SMM, its corresponding bit in the bit map may be set. Then, one of the threads inside the SMM may be selected as a monarch or executing thread (block 430). In various embodiments, the determination of which thread is to be the executing thread may vary. For example, the monarch may be pre-selected (e.g., logical processor 0 on socket 0) or can be selected dynamically via an election mechanism.

Still referring to FIG. 4, each thread may then determine whether it has been selected as the monarch (diamond 435). If not, the thread may enter into a sleep state, where it waits for the monarch thread to signal completion (block 470).

Accordingly, control passes to block 440 for the monarch thread. There, it may determine an ACCOUNTED status for all the threads. In one embodiment, this status may be based on various configuration registers, the SMM indicator map, in addition to a thread presence map, which may also be present in SMRAM. This presence map may be a similar bit map to the SMM indicator map and which may be set during SMM initialization to indicate the threads present in the system. In one embodiment, the determination at block 440 may be a bitwise OR operation as follows: OR (LONG_FLOW_INDICATION, SMI_INHIBITED_IN_SMM_INDICATION) where LONG_FLOW_INDICATION is obtained from a status register that stores a bit vector, each bit of which indicates whether a corresponding thread is in long flow operation, SMI_INHIBITED_INDICATION is obtained from a status register that stores a bit vector, each bit of which indicates whether a corresponding thread is in a SMI-inhibited state, and IN_SMM_INDICATION is the SMM indicator map. The result of the bitwise OR, ACCOUNTED, may be stored in a bitmap, e.g., in SMRAM. After this analysis, control passes to diamond 450 where it may be determined whether the ACCOUNTED status is active for all present threads (diamond 450). This can be determined based on a comparison between the result of the ACCOUNTED operation and the presence map. If not, control passes back to block 440. Otherwise, control passes to block 455, where the SMI event may be processed. Thus the monarch thread may perform the desired SMM code. At the conclusion of the SMM performed by the monarch thread, control passes to block 460. At block 460, the ACCOUNTED status and the SMM indicator map may be reset (block 460). That is, the monarch thread may reset the values in both of these bit maps. Then the monarch thread may signal other logical processors that they may resume from SMI (block 465). In this way, the other threads are released from their waiting loop. Accordingly, at block 475 all the threads may resume from SMM. While shown with this particular implementation in the embodiment of FIG. 4, the scope of the present invention is not limited in this regard.

Embodiments thus enable SMM handler execution without memory dependency, improving reliability. This mechanism also addresses performance and scalability issues associated with SMM so that SMI handling can avoid becoming a bottleneck in multi-core/multi-socket systems. Embodiments thus avoid execution of SMM code with DRAM dependency, enabling high availability usage models where SMM code diagnoses and corrects memory errors.

Embodiments further enable entry into SMM with reduced latency in the presence of a logical processor being in a long flow or SMI-inhibited state. In contrast, presently there is no reliable mechanism by which SMM code can determine if one or more processors will join SMM late or is in a SMM inhibited state, and thus a timeout is set that is larger than the largest long-flow state. This solution, in addition to being unreliable and hard to implement, increases SMM latency and reduces OS real time response and can be overcome using an embodiment of the present invention.

Embodiments may be implemented in code and may be stored on a storage medium having stored thereon instructions which can be used to program a system to perform the instructions. The storage medium may include, but is not limited to, any type of disk including floppy disks, optical disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
   a core comprising:
      a front end unit;
      a plurality of register files coupled to the front end unit, the plurality of register files associated with a plurality of threads;
      a plurality of register sets coupled to the front end unit, each of the plurality of register sets associated with one of the plurality of threads and including a first register to store an indicator to indicate whether the processor is enabled to store an active state of one of the plurality of threads stored in one of the plurality of register files in a storage unit of the processor on entry to a system management mode (SMM) or to a system management random access memory (SMRAM) coupled to the processor; and
      a plurality of execution units to execute instructions; and
   the storage unit to store the active state when the processor is in the SMM.

2. The processor of claim 1, wherein the first register is to be updated by an agent to execute in the SMM.

3. The processor of claim 1, wherein the processor is to execute SMM code stored in the SMRAM.

4. The processor of claim 1, wherein when the SMM is to resolve a memory error, the processor is to obtain recovery SMM code from a non-volatile memory and not to obtain the SMM code from the SMRAM.

5. The processor of claim 1, wherein the storage unit comprises a static random access memory.

6. The processor of claim 1, wherein the core further comprises a retirement unit to retire the instructions executed in the plurality of execution units.

7. The processor of claim 1, wherein the processor comprises a multicore processor including a plurality of cores, an integrated memory controller, and a shared cache memory.

8. A system comprising:
   a processor including a storage unit and a core to execute instructions and to enter a system management mode (SMM), wherein upon entry to the SMM the core is to store an active state of a thread present in an architectural state storage of the core into the storage unit and to insert values associated with the SMM into the architectural state storage, the core including a first status register to store an indicator to indicate that the core is enabled to store the active state in the storage unit and not in a system management random access memory (SMRAM) coupled to the processor; and
   a dynamic random access memory (DRAM) coupled to the processor.

9. The system of claim 8, wherein when the SMM is to resolve a memory error, the processor is to obtain recovery SMM code from a non-volatile memory and not to obtain SMM code from the SMRAM.

10. The system of claim 8, wherein the DRAM includes the SMRAM.

11. A processor comprising:
a storage unit;
a shared cache memory;
a memory controller; and
a core to execute instructions and enter a system management mode (SMM), wherein upon entry to the SMM the core is to store an active state of a thread present in an architectural state storage of the core into the storage unit and insert values associated with the SMM into the architectural state storage, the core including a first status register to store an indicator to indicate whether the core is enabled to store the active state in the storage unit or a system management random access memory (SMRAM) coupled to the processor.

12. The processor of claim 11, wherein the first status register is to be updated when the processor is in the SMM.

* * * * *